United States Patent [19]

Downing et al.

[11] 4,405,678
[45] Sep. 20, 1983

[54] PROTECTED VAPOR-DEPOSITED METAL LAYERS

[75] Inventors: Edward J. Downing; Richard S. Fisch, both of St. Paul, Minn.

[73] Assignee: Minnesota Mining and Manufacturing Company, St. Paul, Minn.

[21] Appl. No.: 350,437

[22] Filed: Feb. 22, 1982

[51] Int. Cl.$^3$ .................... B05D 1/36; B32B 15/08
[52] U.S. Cl. ................................ 428/215; 427/177; 427/178; 427/179; 427/251; 427/255.1; 428/216; 428/458; 428/460; 428/461
[58] Field of Search ............... 428/215, 216, 458, 460, 428/461; 427/177, 178, 179, 251, 255.1

[56] References Cited

U.S. PATENT DOCUMENTS 4,268,541  5/1981  Ikeda et al. ................... 427/177

FOREIGN PATENT DOCUMENTS 56-9736  1/1981  Japan .

Primary Examiner—Marion McCamish
Attorney, Agent, or Firm—Cruzan Alexander; Donald M. Sell; Mark A. Litman

[57] ABSTRACT

The use of organic materials containing carbonyl groups (which are not part of carboxyl group), phenoxy groups, ester groups, or alcohol groups over vapor deposited metal layers improves their mar resistance. These organic materials can improve the properties of the metal layer when used in photoresist imaging films.

17 Claims, No Drawings

PROTECTED VAPOR-DEPOSITED METAL LAYERS

BACKGROUND OF THE INVENTION

1. Field of the Invention

This invention relates to vapor-deposited metal layers which are protected from damage by the application of an organic layer to its surface. The invention further relates to the process of applying the protective organic layer to the surface of the vapor-deposited metal layer and to the photosensitive articles made with the protected metal layer.

In particular, the present invention relates to the application of an organic layer onto the surface of a vapor deposited metal layer. The metal layer is generally formed on a supporting base by any of the various vapor-depositing techniques. Prior to subjecting the deposited metal layer to any physical treatments or stress likely to damage the continuity of the coating (e.g., rolling, folding, bending, and the like) an organic layer is vapor deposited onto the surface of the metal.

2. Description of the Prior Art

Vapor-deposited layers of metals, particularly those on flexible webs, tend to be soft and easily rubbed off. These defects are particularly unacceptable where such layers are to be used as part of an imaging system consisting of a vapor-deposited metal layer and an overcoated photoresist or photopolymer layer. Marks, scuffs, kinks, or abrasions in the metal layer produce voids or areas in the film which contain no useful image, thus interrupting the faithfulness of the image. These photographic defective areas have been called by various names such as pinholes, cinch marks, scuffs, etc., depending on where and how the abrasion was produced. In order to avoid such defects, a protective resin layer is generally coated on the metal layer. This is often done in a separate coating operation on a different coating machine. The difficulty with this practice, however, is that the unprotected vapor-coated metal film must be wound after the vapor-coating operation to transport the material to the more conventional resin coater. Defects such as cinch marks, abrasions, and kinks are often produced during this winding operation.

In order to avoid the problems described above, several attempts have been made to vapor-deposite the metallic and organic layers in the same vaccum chamber, thus eliminating the need to wind the film in a roll between coating operations. One such process is described in U.S. Pat. No. 4,268,541. Here the vapor-deposition chamber is divided into 2 sections, by means of a partition, thereby separating the metal deposition area from the organic deposition section. Thus the organic protective layer is deposited over the metal layer without the need to rewind the roll in between the two coating operations.

The organic compounds used in U.S. Pat. No. 4,268,541 include polymers (for example, those derived from methacrylic acid and acrylic acid), low molecular weight organic compounds containing a carboxyl group (e.g., compounds such as abietic acid, isophthalic acid, behenic acid, terephthalic acid, phthalic acid, etc., and a few random compounds (e.g., Rhodamine B, rosin, a phthalocyanine, a monosaccharide, and an oligosaccharide).

The technique and materials described in U.S. Pat. No. 4,268,541 have been found to be suitable for only limited uses. The layer thickness of 30–600 nm specified is not suitable for many imaging film constructions, and for many processing techniques. In particular, the friction properties of the coating cause layers of the coated material which are stacked or rolled to slide and move out of register. In rolled form, telescoping of the roll is quite serious. This can cause serious delays and expense in further use of the film.

Organic protection layers located between the metal layer and a photoresist layer can drastically affect the oxidizing or etching step and the quality of the resulting image. For, example, excessive thickness of such layers may provide a preferential pathway for the developer or etch solution thereby resulting in image degradation or fine detail loss. This is especially true of material whose final designation is copy or contact reprographic work. Films such as these, called lith or contact films, depend on fine dot arrays to reproduce image tone. Fine dots (3–5%) may be undercut and etched away thereby degrading the quality of the reproduction.

The relatively thick layer of some acid-containing protective materials such as disclosed in U.S. Pat. No. 4,268,541 can also interfere with the etching of the metal by neutralizing the alkaline metal etching solution. Such neutralization inhibits the formation of an etched metal image and thus interferes with the formation of an image of acceptable quality.

Another attempt at overcoming the abrasion problems is described in Japanese patent publication number 56/9736. In this case, the metal and the organic compound are deliberately coated as a single layer; i.e., the metal and organic vapors are substantially mixed in the vapor stream before they are deposited on the support. This is not completely satisfactory because the heated metal vapor can carbonize or decompose the organic material resulting in an unacceptable product. Also, the thickness of the layer is required to be at least 20 to 1000 mm. The scope of organic materials is also quite specific and generally emphasizes organic acid materials.

SUMMARY OF THE INVENTION

The application of layers of organic material with a vapor pressure at 20° C. no greater than 1-n-octanol said material having (1) carbonyl groups whch are not part of carboxyl groups, (2) phenoxy groups, (3) ester groups, (4) urea groups, or (5) alcohol groups onto vapor-deposited metal surfaces has been found to provide excellent damage resistance to the metal layer. The presence of these organic materials on the vapor-deposited metal layer in photoresist imaging constructions provides for uniform development characteristics in the image. These materials reduce or eliminate the low friction properties attendant with the use of acids as protective layers, and because of reduced acidity these materials do not neutralize alkaline developing solutions as much as acid protective layers.

DETAILED DESCRIPTION OF THE INVENTION

The basic article of the present invention comprises a substrate, a vapor-deposited metal layer on at least one surface of said substrate, and a protective organic layer on said metal layer comprising a material having phenoxy groups, alcohol groups, urea groups, ester groups, or carbonyl groups which are not part of carboxyl groups. In a preferred embodiment, a photoresist layer is coated over said protective layer.

The substrate may be any surface or material onto which metal may be vapor-deposited. The substrate may be rough or smooth, transparent or opaque, and continuous or porous. It may be of natural or synthetic polymeric resin (thermoplastic or thermoset), ceramic, glass, metal, paper, fabric, and the like. For most commercial purposes the substrate is preferably a polymeric resin such as polyester (e.g., polyethyleneterephthalate), cellulose ester, polycarbonate, polyvinyl resin (e.g., polyvinylchloride, polyvinylidene chloride, polyvinylbutyral, polyvinylformal), polyamide, polyimide, polyacrylate (e.g., copolymers and homopolymers of acrylic acid, methacrylic acid, n-butyl acrylate, acrylic anhydride and the like), polyolefin, and the like. The polymer may be transparent, translucent or opaque. It may contain fillers such as carbon black, titania, zinc oxide, dyes, pigments, and of course, those materials generally used in the formation of films such as coating aids, lubricants, antioxidants, ultraviolet radiation absorbers, surfactants, catalysts and the like.

The vapor-deposited metal layer may be any vapor-deposited metal or metalloid layer. According to the practice of the present invention, the term metal layer is defined as a layer comprising metal, metal alloys, metal salts, and metal compounds. The corresponding meaning applies to the term metalloid layer. The term metal in metal layer is defined in the present invention to include semi-metals (i.e., metalloids) and semiconductor materials. Metals include materials such as aluminum, antimony, beryllium, bismuth, cadmium, chromium, cobalt, copper, gallium, germanium, gold, indium, iron, lead, magnesium, manganese, molybdenum, nickel, palladium, rhodium, selenium, silicon, silver, strontium, tellurium, tin, titanium, tungsten, vanadium, and zinc. Preferably the metal is selected from aluminum, chromium, nickel, tin, titanium and zinc. More preferably the metal is aluminum. Metal alloys such as aluminum-iron, aluminum-silver, bismuth-tin, and iron-cobalt alloys are included in the term metal layer and are particularly useful. Metal salts such as metal halides, metal carbonates, metal nitrates and the like are useful. Metal compounds such as metal oxides and metal sulfides are of particular utility in imaging systems. Metal layers comprising mixtures of these materials such as mixtures of metal-metal oxides, metal-metal salts, and metal salts-metal oxides are also of particular interest.

The thickness of the vapor-deposited metal layer depends upon the particular needs of the final product. In imaging constructions, for example, the thickness should be at least about 3 nm. Generally, the layer would be no thicker than 750 nm which would require a long etching period. A more practical commercial range would be between 10 and 500 nm. A preferred range would be between 20 and 400 nm and a more preferred range would be between 25 and 300 nm or 30 and 200 nm.

It is preferred that the majority of the cross-section of the metal layer consist essentially of metal, metal alloys, metal salts and metal compounds. Traces of up to 10% or more of other materials may be tolerated generally in the layer, and in fact in certain processes of manufacture the boundary region of the metal layer and the protective layer may have a graded or gradual change from 100% metal to 100% organic material. But metal layers with the majority (at least 50%) of its cross-section consisting essentially of metals, metal alloys, metal salts, metal compounds and combinations thereof are preferred. The metal layer should have fewer than 100, preferably fewer than 50, and more preferably fewer than 30 defects per 177 mm$^2$.

Vapor-deposition of the metal layer may be accomplished by any means. Thermal evaporation of the metal, ion plating, radio frequency sputtering, A.C. sputtering, D.C. sputtering and other known processes for deposition may be used in the practice of the present invention. The pressure may vary greatly during coating, but is usually in the range of $10^{-6}$ to $10^{-4}$ torr.

The organic protective layer comprises a material with a vapor pressure at 20° C. no greater than that of 1-n-octanol selected from the group consisting of (1) organic materials having carbonyl groups which are not part of carboxyl groups, (2) phenoxy groups, or (3) alcohols. The term "organic material" is used because the protective coating does not have to be a single compound or a monomeric compound. In addition to those types of materials, dimers, trimers, oligomers, polymers, copolymers, terpolymers and the like may be used.

The organic materials containing carbonyl groups which are not part of a carboxyl group, for example, include (1) amides, such as phthalamide, salicylamide, urea formaldehyde resins, and methylene-bis-acrylamide, and (2) anilides, such as phthalanilide and salicylanilide. It has been found that these organic materials may be used in layers as thin as 1 nm and provide good abrasion or mar protection. They may be used in thicknesses of up to 600 nm, but without dramatic improvement of results, and in fact often with some diminution of properties. A preferred range would be between 3 and 200 nm, more preferably between 5 and 100 nm, and most preferably at least 5 and lower than 30 or 20 nm.

The organic material containing ester groups includes such materials as polyester oligomers, low molecular weight polyester polymers (e.g., polyethyleneterephthalate, polyethyleneisophthalate, etc. having molecular weights between 5,000 and 50,000), diallyl phthalate (and its polymers), diallyl isophthalate (and its polymers), monomethyl phthalate, carboxylic acid alkyl esters, and the like.

The organic material containing phenoxy groups include such materials as Bisphenol A, and low molecular weight phenol formaldehyde resins (e.g., Resinox ®). The alcohol containing materials would include 1-n-octanol, dodecanol, benzyl alcohol and the like.

The organic material should be vapor-depositable as this is the general method preferred for application of the protective layer. The organic material may, for example, be deposited in the apparatus and procedures disclosed in U.S. Pat. No. 4,268,541. The partition or baffle described in that apparatus (e.g., Example 1) has not been found to be essential. The two vapor streams (i.e., metal and organic material streams) may be physically spaced apart or directed so that the coating zones for the two materials do not completely overlap. No serious problem has been found even when 50% of each of the coating zones overlap (so that at least 50% of the thickness of the metal layer consists essentially of metal, metal salts, metal compounds, and combinations thereof), although this is not a preferred construction. It is preferred that less than 25% of the total weight of the metal component be in such an overlapping or mixing zone and more preferably less than 10% or even 0% be in such zones. The recitation of a metal layer in the practice of the present invention requires, however, that at least a region of the coating, usually adjacent to the substrate, consists essentially of a metal layer without a dispersed phase of organic material therein.

The photoresist layer may be either a negative-acting or positive acting photoresist as known in the act. Positive acting photoresist systems ordinarily comprise polymeric binders containing positive acting diazonium salts or resins such as those disclosed, for example, in U.S. Pat. Nos. 3,046,120, 3,469,902 and 3,210,239. The positive acting photosensitizers are commercially available and are well reported in the literature. Negative acting photosensitive resist systems ordinarily comprise a polymerizable composition which polymerizes in an imagewise fashion when irradiated, such as by exposure to light. These compositions are well reported in the literature and are widely commercially available. These compositions ordinarily comprise ethylenically or polyethylenically unsaturated photopolymerizable materials, although photosensitive epoxy systems are also known in the art. Preferably ethylenically unsaturated photopolymerizable systems are used, such as acrylate, methacrylate, acrylamide and allyl systems. Acrylic and methacrylic polymerizable systems are most preferred according to the practice of the present invention. U.S. Pat. Nos. 3,639,185, 4,247,616, 4,008,084, 4,138,262, 4,139,391, 4,158,079, 3,469,982, U.K. Pat. No. 1,468,746, disclose photosensitive compositions generally useful in the practice of the present invention. U.S. Pat. No. 4,314,022 discloses etchant solutions particularly useful in the practice of the present invention.

The following examples further illustrate practice of the present invention.

EXAMPLE 1

Using the apparatus described in U.S. Pat. No. 4,268,541 without a baffle, a $10^{-4}$ m polyester web was coated by vacuum deposition with 70 nm of aluminum. During the same operation in the same vacuum chamber a layer of a commercially available terpolymeric acrylate material (derived from 62% methylmethacrylate, 36% n-butylacrylate and 2% acrylic acid by weight) was applied. This sample represents an article made according to the teachings of U.S. Pat. No. 4,268,541. A control length of non organic-coated aluminum film was also produced. Ellipsometric measurements of the resultant organic/metal package indicated that the thickness of the acrylate layer was 30.5 nm.

The resultant aluminum plus organic coated material was examined by way of transmitted light and exhibited very few pinholes or defects. The otherwise soft aluminum layer of this package could not be rubbed off using thumb pressure. The non organic coated aluminum film could be rubbed off using thumb pressure.

Both the organic vapor coated sample and the unprotected sample were immersed in a bath of 1.2% sodium hydroxide and 3% of the tetra sodium salt of nitrilotriacetic acid at 32° C. The unprotected Al layer was uniformly, cleanily oxidized away in 15 seconds. The organic-protected layer was not cleanly removed. In fact, the aluminum lifted off in sections during the immersion time and then the aluminum generally oxidized in solution.

EXAMPLE 2

Using the apparatus described in the Example 1, a 2000 meter continuous web was vapor coated with a 70 nm layer of aluminum and immediately thereafter in the same chamber, a 10 nm layer of terephthalic acid was applied. At the 1400 meter level, the terephthalic coated roll telescoped on itself and telescoped further when removed from the chamber. After removal from the chamber, the vapor-coated aluminum/terephthalic acid roll was judged to be unacceptable for production purposes.

EXAMPLE 3

Using the technique described in Example 1, three more rolls of 2000 meters were coated and a different organic material applied to the aluminum of each of these rolls. Roll A contained an organic layer (on top of the aluminum layer) consisting of Resinox, a phenol formaldehyde condensate resin made by the Monsanto Corp.

Roll B was identical to Roll A except than an organic layer of Vitel 200, a low molecular weight polyester resin (approximately 10,000 molecular weight) made by and commercially available from Goodyear was applied to the aluminum layer. Roll C consisted of a control roll of vapor-coated aluminum film identical to rolls A and B with no organic protective coating.

None of these three rolls telescoped.

EXAMPLE 4

Using the apparatus of Example 1, the following materials were applied to vapor-coated aluminum webs in various thicknesses from 15 to 250 nm.
(1) Dimethyl terephthalate
(2) Phthalic anhydride
(3) Mono methyl phthalate
(4) Dapon 35-a diallyl phthalate prepolymer made by FMC Corp.
(5) Bisphenol A
(6) Epon 828-an epoxy resin made by the Shell Corp.
(7) Michlers Ketone
(8) Benzophenone
(9) Benzyl alcohol
(10) Salacylamide These materials were unrolled after coating and inspected with a 10X hand lens by transmitted light. The defects in an area of 177 mm$^2$ were counted and compared to those of a non-organic coated aluminum film prepared as a control. The control film exhibited defect levels over 100. The materials tested had defect levels of 30 or less. The control material that had no protective layer could be rubbed off using thumb pressure—the organic protective material could not. None of the above materials felt slippery and none produced any telescoping during or after rolling.

EXAMPLE 5

Using the apparatus of Example 1, two coatings were made on top of a 70 nm aluminum layer, one using a protective coating of Resinox as the organic layer; another using terephthalic acid as the organic layer. Both these organic layers were applied to produce an organic layer of about 5 nm thickness as determined by a Gaertner Ellipsometer.

These two webs were further coated with a resist layer of the type described in our copending application Ser. No. 350,737, filed this same day in the name of B. Cederberg et al. A control web consisting of only the 70 nm aluminum layer was prepared as well.

After coating and drying these films were exposed to a 10 step Stauffer grey scale using a 2 kw Berkey Ascor printing source (light to film distance 1 mtr) for 15 seconds. The exposed films were developed in the processing solution described in Example 1 of U.S. Pat. No.

4,314,022 for 30 sec, at 38° C. followed by a warm water wash. On inspection it was evident that the Resinox and control film had grey scale values of step 5, the terephthalic acid roll however had a grey scale value of 7 indicating a faster, more uncontrolled development.

EXAMPLE 6

Using the technique of Example 1, a Vitel 200 polyester coating was applied in a thickness of 10 nm to various metal layers including
(1) Tin
(2) Copper
(3) Aluminum/Mg (Al 94.8%; Mg 5.0%; Mn 0.1%; Cr 0.1%)
(4) Aluminum plus Iron (ratio $Al_2Fe_5$)
(5) Nickel A control non-organic coated layer was included for each metal while thumb action rubbing was able to remove the unprotected metal. The protected metal layers (organic coated) would not rub off.

I claim:

1. An article comprising a substrate having on at least one surface thereof a vapor deposited metal layer and adhered to said metal layer a layer of 1 to 600 nm comprising an organic material having a vapor pressure at 20° C. less than or equal to that of 1-n-octanol and having (a) a carbonyl group which is not part of a carboxyl group, (b) a phenoxy group, (c) an ester group, or (d) an alcohol group.

2. The article of claim 1 wherein at least 50% of the thickness of said metal layer consists essentially of a material selected from the group consisting of metals, metal compounds, metal salts and combinations thereof.

3. The article of claim 1 wherein at least 75% of the thickness of said metal layer consists essentially of a material selected from the group consisting of metals, metal compounds, metal salts and combinations thereof and said organic material having a thickness between 3 and 200 nm.

4. The article of claim 1 wherein said metal layer consists essentially of a material selected from the group consisting of metals, metal compounds, metal salts and combinations thereof.

5. The article of claims 1, 2, 3 or 4 wherein said organic material is selected from the group consisting of amides, anilides, bisphenol A, phenol formalde resins, polyester resins having a molecular weight between 5,000 and 50,000, and alcohols having a vapor pressure at 20° C. no higher than that of 1-n-octanol.

6. The article of claim 5 having coated over said organic material a photoresist layer.

7. The article of claims 1, 3 or 4 wherein said organic material is selected from the group consisting of phthalamide, salicylamide, phthalanilide, salicylanilide, aliphatic alcohols of at least eight carbon atoms, benzyl alcohol, urea formaldehyde resin, and polyester resin.

8. The article of claim 7 having coated over said organic material a photoresist layer.

9. The article of claims 1, 2, 3 or 4 having coated over said organic material a photoresist layer.

10. The article of claim 1 having coated over said organic layer a positive acting photoresist layer and wherein said metal layer is from 10 to 500 nm and consists of metal, metal oxide or combinations thereof and said organic layer is from 3 to 200 nm thick.

11. A process for improving the abrasion resistance of vapor deposited metal layers which comprises vapor depositing a metal layer on at least one surface of a substrate and, before subjecting the metal layer to physical treatment or contact which would abrade the metal layer, vapor depositing onto said metal layer a 1 to 600 nm layer of organic material having a vapor pressure at 20° C. equal to or less than that of 1-n-octanol said material having (a) a carbonyl group not part of a carboxyl group, (b) a phenoxy group, (c) an ester group, or (d) an alcohol group.

12. The process of claim 11 wheren at least 50% of the thickness of said metal layer consists essentially of a material selected from the group consisting of metals, metal compounds, metal salts, and combinations thereof.

13. The process of claim 11 wherein at least 75% of the thickness of said metal layer consists essentially of a material selected from the group consisting of metals, metal compounds, metal salts and combinations thereof.

14. The process of claim 11 wherein said metal layer consists essentially of a material selected from the group consisting of metals, metal compounds, metal salts, and combinations thereof.

15. The process of claims 11, 12, 13, or 14 wherein said organic material is selected from the group consisting of amides, anilides, bisphenol A, phenol formaldehyde resins, low molecular weight polyesters, and alcohols having a vapor pressure at 20° C. no higher than 1-n-octanol.

16. The process of claims 13 or 14 wherein said organic material is selected from the group consisting of phthalamide, salicylamide, urea-formaldehyde resin, phthalanilide, salicylanilide, aliphatic alcohols of at least eight carbon atoms, and benzyl alcohol.

17. The process of claims 13 or 14 wherein said organic material is selected from the group consisting of alkyl esters of carboxylic acids, polyester oligomers, and polyester polymers.

* * * * *